(12) United States Patent
Lapanik et al.

(10) Patent No.: US 7,747,977 B1
(45) Date of Patent: Jun. 29, 2010

(54) METHOD AND SYSTEM FOR STENCIL DESIGN FOR PARTICLE BEAM WRITING

(75) Inventors: Dmitri Lapanik, Kanagawa (JP); Shohei Matsushita, Kanagawa (JP); Takashi Mitsuhashi, Kanagawa (JP); Zhigang Wu, Kanagawa (JP)

(73) Assignee: D2S, Inc., San Jose, CA (US)

( * ) Notice: Subject to any disclaimer, the term of this patent is extended or adjusted under 35 U.S.C. 154(b) by 535 days.

(21) Appl. No.: 11/226,253

(22) Filed: Sep. 15, 2005

(51) Int. Cl. *G06F 17/50* (2006.01)
(52) U.S. Cl. ........................................ 716/21
(58) Field of Classification Search ............ 716/19–21; 204/298.31, 298.36; 250/492.22
See application file for complete search history.

(56) References Cited

U.S. PATENT DOCUMENTS

| | | | |
|---|---|---|---|
| 5,241,185 A | 8/1993 | Meiri et al. | |
| 5,424,173 A | 6/1995 | Wakabayashi | |
| 6,087,046 A | 7/2000 | Nakasuji | |
| 6,107,207 A | 8/2000 | Waas et al. | |
| 6,350,992 B1 * | 2/2002 | Manabe et al. | 250/492.22 |
| 6,481,004 B2 | 11/2002 | Inanami et al. | |
| 6,546,543 B1 * | 4/2003 | Manabe et al. | 716/21 |
| 6,546,544 B1 | 4/2003 | Kawakami | |
| 6,560,768 B2 | 5/2003 | Inanami et al. | |
| 6,677,089 B2 | 1/2004 | Ogino et al. | |
| 6,815,693 B2 | 11/2004 | Kamijo et al. | |
| 6,821,685 B2 | 11/2004 | Takita et al. | |
| 7,024,638 B2 | 4/2006 | Scheffer et al. | |
| 7,249,342 B2 | 7/2007 | Pack et al. | |
| 2002/0010906 A1 * | 1/2002 | Inanami et al. | 716/21 |
| 2002/0116697 A1 * | 8/2002 | Okamoto et al. | 716/21 |
| 2003/0206283 A1 * | 11/2003 | de Jager et al. | 355/67 |
| 2005/0216875 A1 * | 9/2005 | Zhang et al. | 716/9 |
| 2006/0119814 A1 * | 6/2006 | Cummings | 355/53 |
| 2007/0125967 A1 | 6/2007 | Lapanik et al. | |

OTHER PUBLICATIONS

Hattori, K. et al., "Electron Beam Direct Writing System EX-8D Employing Character Projection Exposure Method", Journal of Vacuum Science Technology, vol. B11(6) (1993), pp. 2346-2351, American Vacuum Society, 125 Maiden Lane, 15th Floor, New York, NY 10038.

Hara, S. et al., "Character Projection EB Data Conversion System Combined with Throughput Analyzer", Japanese Journal of Applied Physics, vol. 33 (1994), pp. 6935-6939, Japan Society of Applied Physics, Kudan-Kita building 5th floor, Kudan-Kita 1-12-3, Chiyoda-ku, Tokyo 102-0073, Japan.

(Continued)

*Primary Examiner*—Vuthe Siek
*Assistant Examiner*—Aric Lin
(74) *Attorney, Agent, or Firm*—The Mueller Law Office, P.C.

(57) ABSTRACT

Various embodiments of the present invention relate to particle beam writing to fabricate an integrated circuit on a wafer. In various embodiments, cell projection (CP) cell library information is stored in the form of a data structure. Subsequently, the CP cell library information is referenced by a writing system. The patterns are written on the wafer depending on the referenced CP cell library.

12 Claims, 15 Drawing Sheets

OTHER PUBLICATIONS

Nakasugi, T. et al. "Maskless Lithography Using Low Energy Electron Beam: Recent Results of Proof-of-Concept Tool", Journal of Vacuum Science Technology, vol. B20(6) (2002), pp. 2651-2656, American Vacuum Society, 125 Maiden Lane, 15th Floor, New York, NY 10038.

Manakli, S. et al., "New Electron Beam Proximity Effects Correction Approach for 45 and 32nm Nodes", Japanese Journal of Applied Physics, vol. 45 (2006), pp. 6462-6467, Japan Society of Applied Physics, Kudan-Kita building 5th floor, Kudan-Kita 1-12-3, Chiyoda-ku, Tokyo 102-0073, Japan.

* cited by examiner

METHOD AND SYSTEM FOR STENCIL DESIGN FOR PARTICLE BEAM WRITING

BACKGROUND

The present invention relates to particle beam writing using a Cell Projection system for fine image fabrication.

A particle beam writer uses one or more beams of particles to generate a given pattern on a plate. The plate is covered with a particle sensitive material. By way of example, consider the case of an Electron Beam Writing (EBW) technology. The EBW technology uses an electron beam to generate various patterns, by way of example, an integrated circuit pattern, on a substrate wafer.

A fundamental problem with the conventional optical lithography is the image quality degradation and the resolution limits caused by an optical proximity effect. One method to overcome this problem is an Electron Beam Direct Writing (EBDW) technology, a variation of the EBW technology. The theoretical resolution of an electron beam is finer, which allows writing denser layouts. The EBDW technology can be used for low-volume IC production at 90 nm and below. However, this technology has a lower throughput.

Several methods have been conventionally used to increase the throughput of IC fabrication. One such method is based on a Variable Shape Beam (VSB) technology, which facilitates writing patterns by using particle beam shots of fixed and simple shapes with variable size. By way of example, the simple shapes include rectangles and triangles. Further, the VSB-type EBW performs proximity effect correction by dose control, shape biasing and minute fracturing. However, such manipulations increase writing time.

Another conventional method used for IC fabrication is Cell Projection (CP) technology, which is also referred to as Character Projection or Block Projection. CP technology uses a stencil, which enables writing complicated repetitive patterns by one exposure shot. The throughput of a particle beam lithography system that writes circuits, measured in complete circuits written per unit of time, can be properly approximated by the number of exposures required to write the circuit. The number of exposures required to write the circuit is known as the shot count. A lower shot count results in a higher throughput and a higher shot count results in a lower throughput. By reducing the shot count, CP technology reduces the overall exposure time and increases the system throughput. However, the technique is limited by several restrictions pertaining to the geometric sizes and kind of figures that can be expressed. In addition, the proximity effect correction becomes a very challenging task.

In light of the foregoing discussion, a need exists for a method and system that improves the throughput of EBW technology and simultaneously maintains high accuracy using the CP system. Further, the system should be capable of effectively performing PEC, as well as providing the optimal design of the stencil. The present invention addresses such a need.

SUMMARY

Aspects for particle beam writing, to fabricate an integrated circuit on a wafer, include cell-projection (CP) cell library information stored in the form of a data structure. These aspects further include referencing the CP cell library information by means of a writing system. Subsequently, depending on the referenced CP cell library, the patterns are written on the wafer.

A design for creating a layout suitable for CP type electron-beam writing is achieved by supplying stencil design result information in the form of a data structure or a data file through the present invention. The throughput and accuracy of the particle beam writing system can be increased in this manner. These and other advantages will be more fully appreciated in conjunction with the following detailed description and accompanying drawings.

BRIEF DESCRIPTION OF THE DRAWINGS

Various embodiments of the present invention will hereinafter be described in conjunction with the appended drawings, provided to illustrate and not to limit the present invention, wherein like designations denote like elements, and in which.

DESCRIPTION OF VARIOUS EMBODIMENTS

Various embodiments of the present invention relate to particle beam writing to fabricate an integrated circuit on a wafer. In various embodiments, cell projection (CP) cell library information is stored in the form of a data structure. Subsequently, the CP cell library information is referenced by a writing system. The patterns are written on the wafer depending on the referenced CP cell library.

Figure 1:
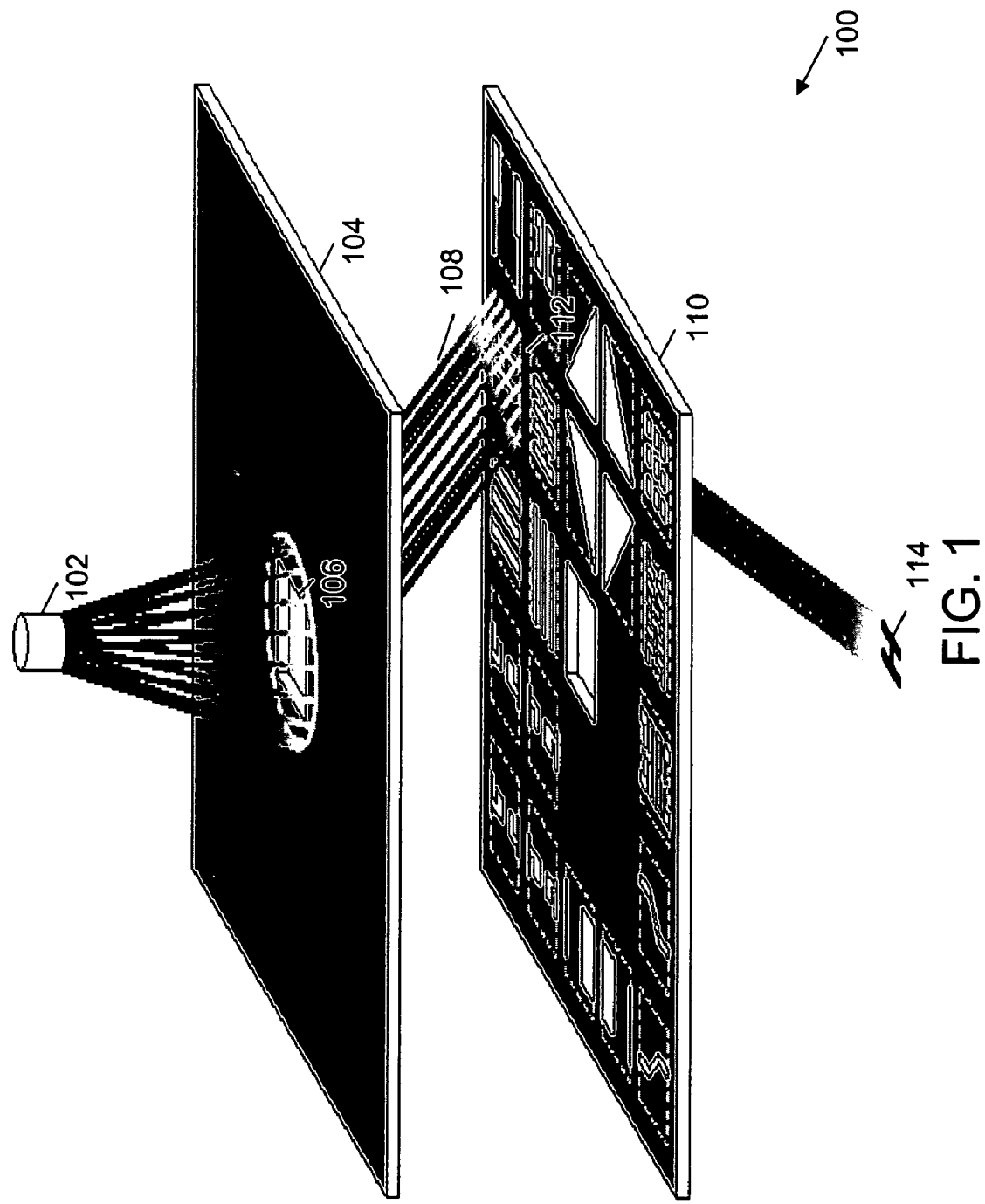
FIG. 1 illustrates an example of a block diagram of a cell projection (CP)-type particle beam writing device, wherein various embodiments of the present invention can be practiced.

FIG. 1 illustrates an example of a block diagram 100 of a cell projection (CP) type particle beam writing device, wherein various embodiments of the present invention can be practiced. It is to be noted that the electron beam writing device has been shown for the purpose of illustration only. The embodiments of the invention are applicable to any particle beam writing device such as an ion beam writing device. Further, the embodiments of the present invention are applicable not only to wafer writing devices, but also to pattern writing devices, by way of example, a mask writing machine. Example block diagram 100 includes an electron gun 102, a first shaping aperture plate 104, a rectangular aperture 106, a rectangular-shaped beam 108, a second shaping aperture plate 110, CP cells including a CP cell 112, and an image 114.

Electron gun 102 emits electrons. These electrons pass through rectangular section 106 of first shaping aperture plate 104, after which the electrons are transferred as rectangular-shaped beam 108. CP cells placed on second shaping aperture plate 110 can be illuminated by deflecting rectangular-shaped beam 108. For example, CP cell 112 on second shaping aperture 110 is illuminated by deflecting rectangular-shaped beam 108. As a result, the pattern, in the shape of 'H', is written on the wafer.

In accordance with an embodiment of the present invention, the plate where CP cells are placed is referred to as a stencil or a stencil mask, which is a set of pattern openings on second shaping aperture 110. These set of pattern openings are intended images that can be written on the wafer in one exposure shot. The cross-sectional form of rectangular-shaped beam 108, passing the openings of CP cells, varies according to the shape of the CP cells. The shaped beam passes through a system of lenses and deflectors. The image written on the wafer is generally a demagnified version of a CP. The wafer has layers of a resist laid on it. The resist is a particle beam sensitive material that changes its chemical properties when exposed to a particle beam.

Various embodiments of the present invention relate to methods for designing second shaping aperture 110. Further, various embodiments of the present invention relate to designing the shape and corresponding data-processing method of second shaping aperture 110.

Figure 2:
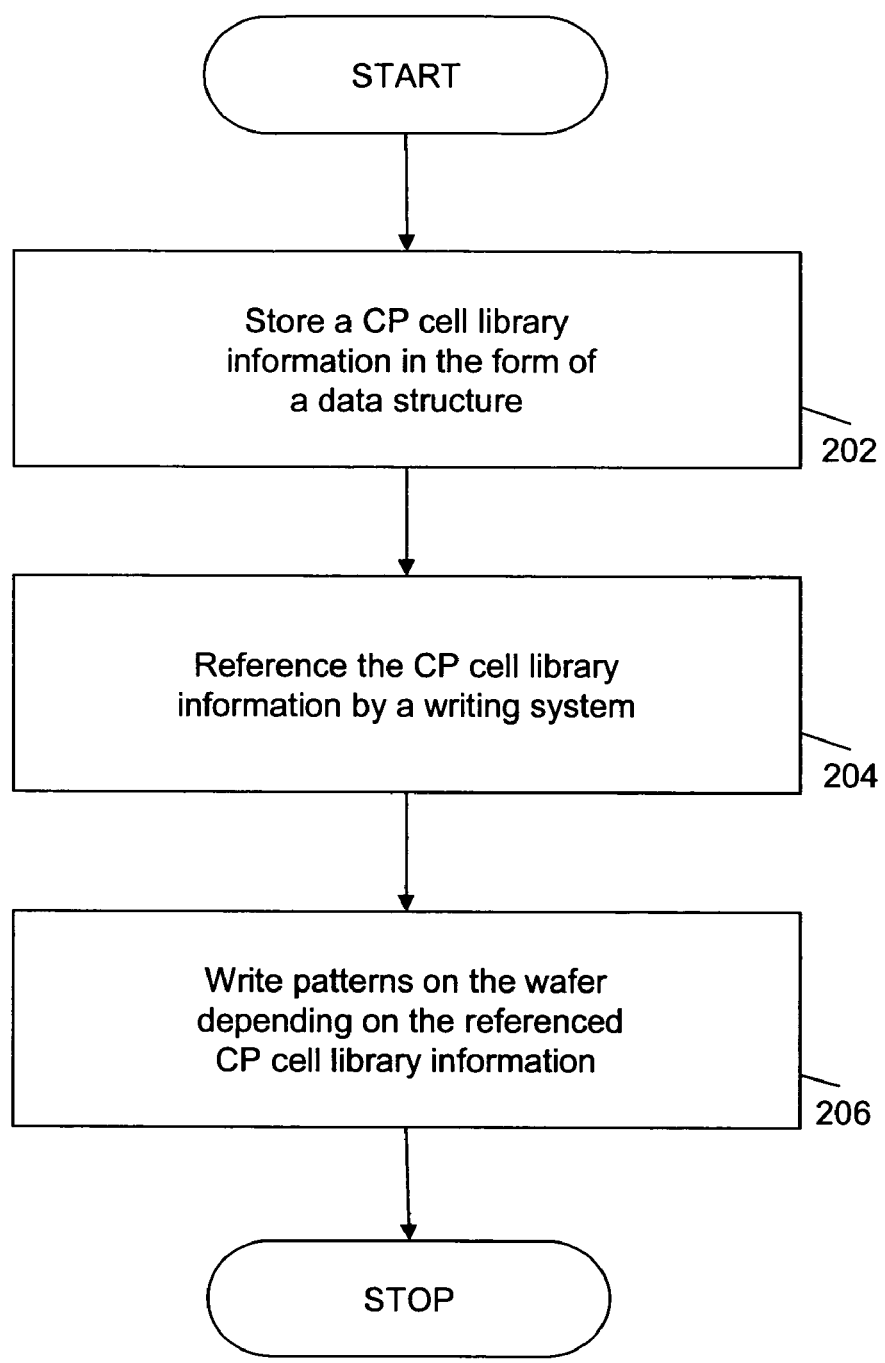
FIG. 2 illustrates a flowchart for particle beam writing to fabricate an integrated circuit on a wafer, in accordance with an embodiment of the present invention.

FIG. 2 illustrates a flowchart for particle beam writing to fabricate an integrated circuit on a wafer, in accordance with an embodiment of the present invention. The fabrication of the integrated circuit involves writing a plurality of to patterns on the wafer. The plurality of patterns corresponds to the integrated circuit that is to be fabricated. The pattern includes various geometric elements that are parts of the layout of the integrated circuit. In many cases, such pattern groups are related to standard cells. Other forms of pattern groups are also possible. Certain patterns for the plurality of patterns are present on the stencil, as depicted in FIG. 1. The patterns that are present on the stencil can be written in one particle beam shot, while the VSB technology would require a number of shots to write one stencil pattern. By placing highly repetitive patterns from the plurality of patterns on a stencil, the same layout can be written considerably faster, as less number of shots is necessary.

A stencil layout describes the geometry of the stencil. The formation of a stencil layout is critical and is mostly carried out by a stencil design system.

At act 202, a CP cell library information is stored in the form of a data structure. The CP cell library information is generated by a stencil design system. Storing the CP cell library information includes storing the position of the plurality of CP cells on a stencil. Each CP cell pattern may, by way of example, represent a standard cell. However, the size of a CP cell is restricted by hardware. If the size of the standard cell exceeds the limit, the standard cell is separated into a plurality of CP cells. By way of example, the data structure can be modeled in a hierarchical manner. This has been explained in conjunction with FIG. 3.

At act 204, the CP cell library information is referenced by a writing system. The writing system includes various techniques for imaging on the wafer. By way of example, the technique can be an electron beam writing device. Subsequently, at act 206, the patterns are written on the wafer, depending on the referenced CP cell library.

In accordance with an embodiment of the present invention, stencil layouts can be generated by computer-aided design (CAD) systems. Such stencil layouts utilize the information about CP cells on the stencil. In the case of a logic synthesis, it is possible to use CP cell library information preferentially. Consequently, the throughput of the writing system can increase.

In accordance with another embodiment, the number of CP cells can be decreased. Further, maximum usage of CP cells can be made on the stencil by using the CP cell library information. This is achieved by using a combination of multiple buffer cells and a single functional cell for generating multiple fan-out cells for the function. This method reduces the required number of CP cells. For this purpose, information pertaining to CP cell needs to be provided to the design system.

In accordance with an embodiment of the present invention, two or more CP cells of the same pattern can be placed on a stencil. This is because it is possible that a CP cell is used many times. Frequent use of a CP cell during writing can pollute the cell so that the stencil needs to be cleaned. The contamination problem in a frequently used CP cell is serious. To increase the time between stencil cleanings, a plurality of CP cells containing the same pattern are prepared.

Figure 3:
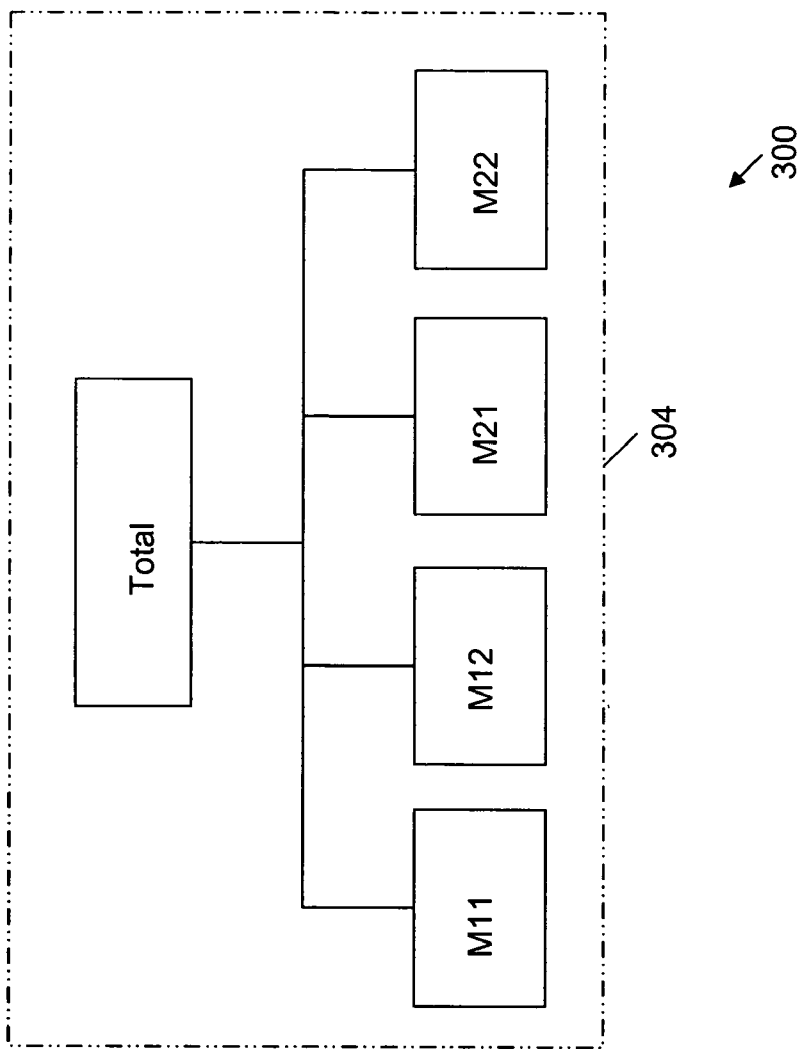
FIG. 3 illustrates a hierarchical data structure for separating a cell into a plurality of the CP cells, in accordance with an embodiment of the present invention.
Figure 3:
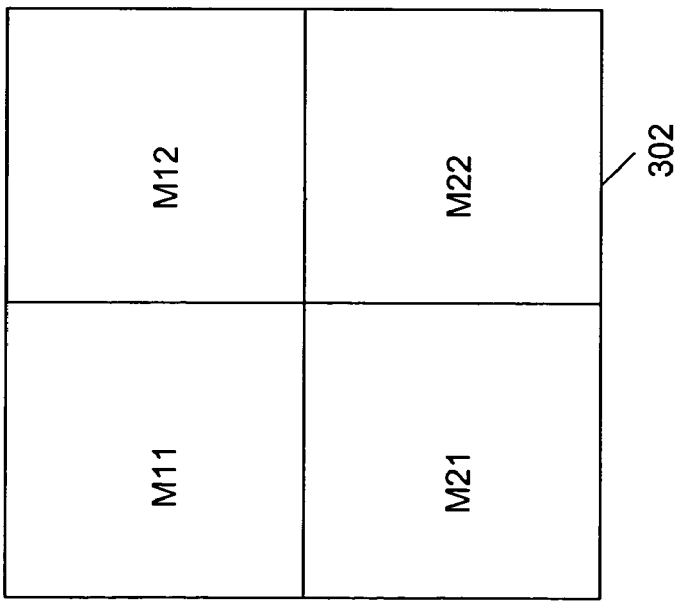

FIG. 3 illustrates a block diagram 300 for the division of a plurality of the patterns into a plurality of CP cells and the corresponding data structure of the library database. The size of the CP cells is limited to a pre-determined maximum size. The pre-determined maximum size is determined by hardware. A CP cell size cannot exceed this pre-determined maximum size. As a result, a CP cell exceeding the pre-determined maximum size needs to be separated into two or more CP cells.

Block diagram 300 includes a pattern 302 and its corresponding data structure 304, referred to as 'total'. Pattern 302 is separated into four CP cells, M11, M12, M21, and M22. The data structure for pattern 302 is modeled in a hierarchical manner. The hierarchical data structure has been depicted by block 304. The data structure for pattern 304 can be stored in a CP cell library. By way of example, the data structure can be stored in CP Cell Library database. The CP Cell Library database can be used for a larger integrated circuit design.

In accordance with various embodiments of the present invention, a stencil design system suitable for a CP cell type particle beam writer can be used for precise and high throughput writing. The stencil design system is critical for a CP cell type particle beam writer. As discussed in conjunction with FIG. 1, the stencil design system is a data-processing system for designing second shaping aperture 110. By way of example, the input to the stencil design system is provided through a design library. By way of example, the CP cell patterns correspond to a standard cell, or a part of the standard cell. This facilitates evaluation of throughput improvement and shot number reduction. The output of the stencil design system includes a file, which is referred to as 'GDS2 for CP Stencil'. This file includes pattern information prepared for a stencil-manufacturing organization, which can be a mask shop.

Figure 4:
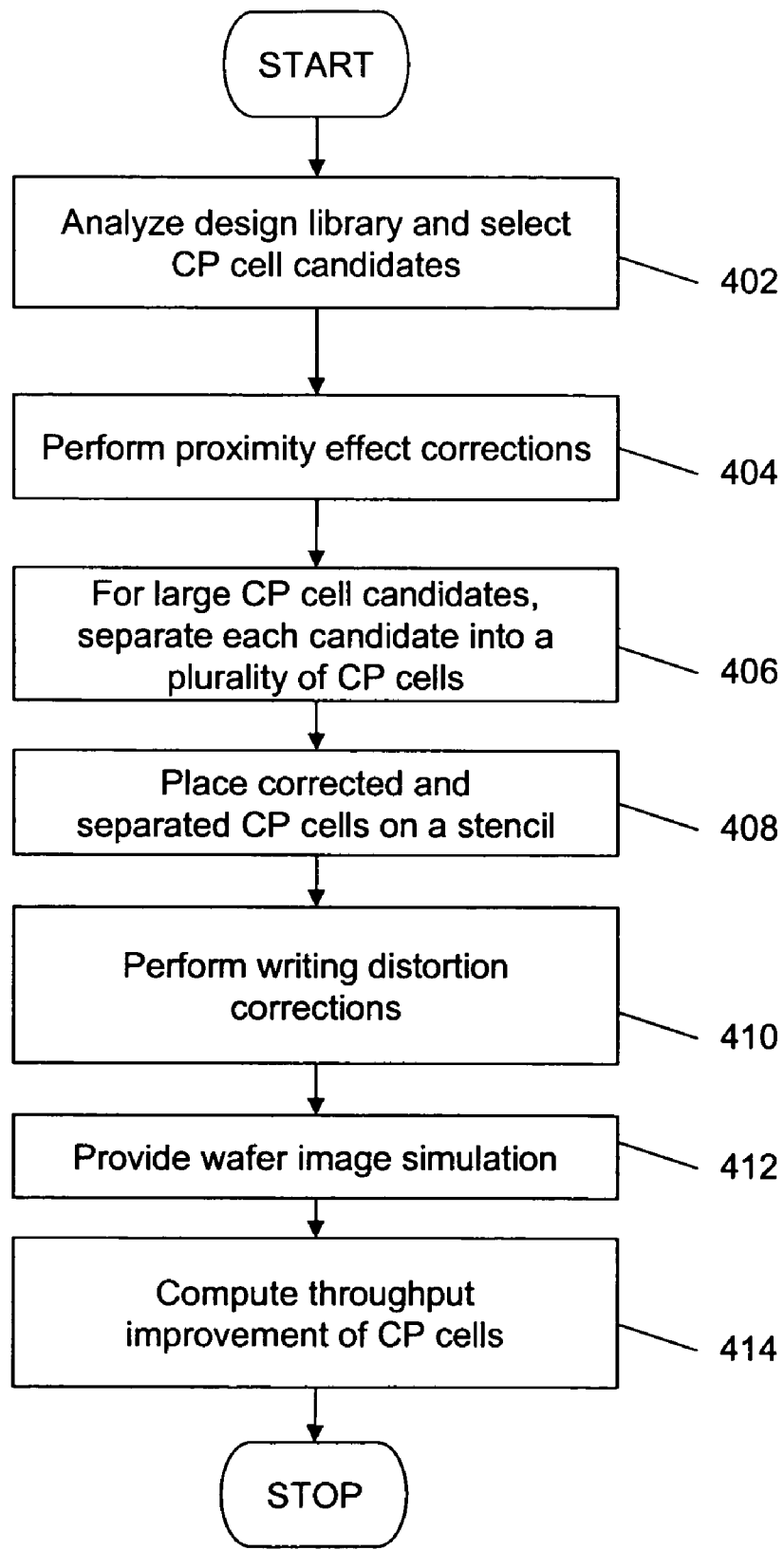
FIG. 4 illustrates a flowchart for a stencil design process, in accordance with an embodiment of the present invention.

FIG. 4 illustrates a flowchart for a stencil design, in accordance with an embodiment of the present invention. At act 402, a design library is analyzed and CP cell candidates are selected.

At act 404, proximity effect corrections are performed. Methods of performing the proximity effect corrections according to various embodiments of the present invention are described in conjunction with FIGS. 7 and 8.

At act 406, each large CP cell candidates is separated into a plurality of CP cells. A CP cell candidate is referred to as larger if the size of the CP cell candidate is larger than a maximum CP cell size. This has been explained in conjunction with FIG. 5.

At act 408, the corrected and separated patterns are placed on a stencil. At act 410, writing distortion corrections are performed. The writing distortion corrections are performed on the placed CP cells.

At act 412, wafer image simulation is provided. The wafer image simulation can be displayed on a display device. As a result, a designer can perform proximity effect corrections manually through a layout editor. The proximity effect simulation-displaying functionalities are selected from a group that includes manual cell selection and CP cell pattern edition functionalities. Subsequently, at act 414, the improvement in particle beam writing system throughput by using CP cells is computed for the design library cells. By way of example, a possible baseline for throughput improvement is writing throughput with VSB. Such computations are based on the results of proximity effect simulation and are similar to those used for the proximity effect corrections.

Figure 5:
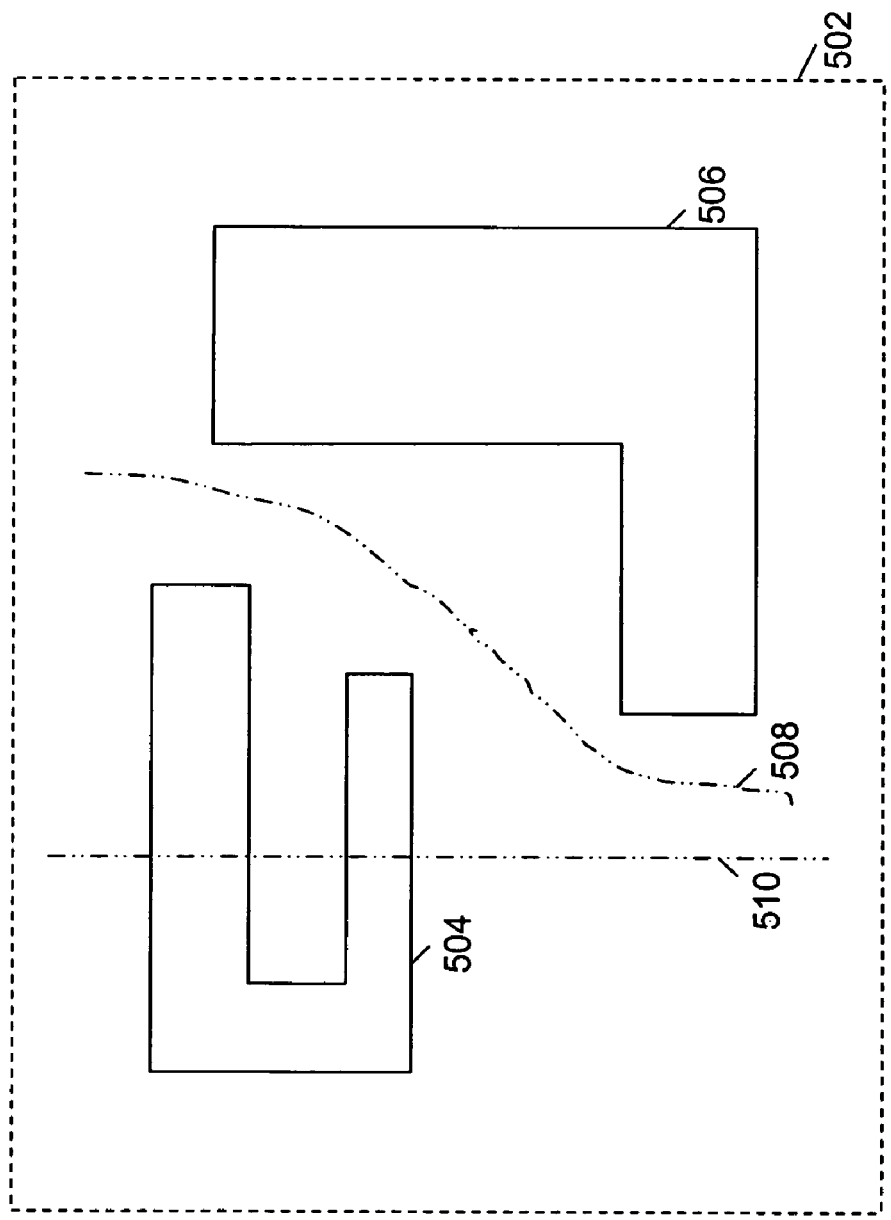
FIG. 5 illustrates a pattern separation method for reducing stitching errors in critical areas, in accordance with an embodiment of the present invention.

FIG. 5 illustrates a pattern separation method for reducing stitching errors in critical areas of the integrated circuit, in accordance with an embodiment of the present invention. The proper operation of the integrated circuit is particularly sensitive to the precise writing of patterns in certain areas of the circuit called critical areas. As described at act 406, a pattern may need to be separated. This can result in errors in critical areas. The stitching error is an alignment error which can occurs when the particle beam writing system stitches two patterns. For example, consider a first pattern 502, which includes a second pattern 504, a third pattern 506, a separating curved line 508, and a separating line 510. If second pattern 504 is cut by separating line 510, it is possible that first pattern 502 will be written incorrectly due to stitching errors.

Various embodiments of the present invention relate to a pattern separation method, which minimizes the number of patterns split by using a flexible cut line. By way of example, the flexible cut line has been illustrated by separating curved line 508. If first pattern 502 is separated by separating curved line 508, no stitching errors occur and second pattern 504 and third pattern 506 are written correctly.

Figure 6:
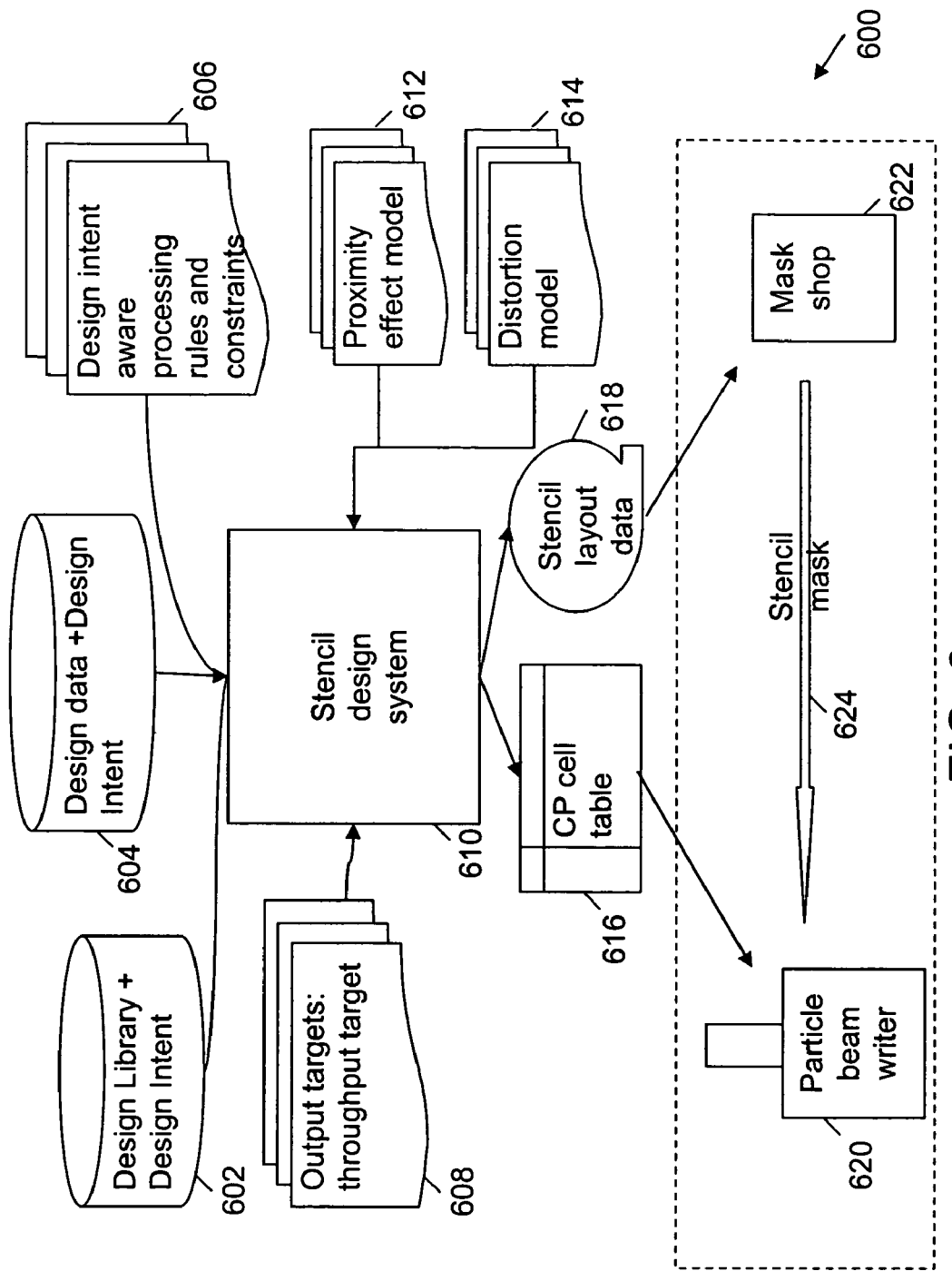
FIG. 6 illustrates a block diagram for a stencil design system, in accordance with various embodiments of the present invention.

FIG. 6 illustrates a block diagram 600 of a stencil design system, in accordance with various embodiments of the present invention. Block diagram 600 includes blocks 602, 604, 606, 608, a proximity effect model 612, a distortion model 614; a stencil design system 610, a CP cell table 616, and a stencil layout data 618. A particle beam writer 620, a mask shop 622, and a stencil mask 624 do not form a part of stencil design system 610, but are provided for better understanding as the major targets for output of a stencil design system. Block 602 includes design library and design intent. The design library includes groups of geometric elements that are a part of the layout. In many cases, such pattern groups can be related to standard cells. Other forms of pattern groups are also possible. By way of example, a memory module and an arithmetic module are different usages in a design library. A module compiler uses such pattern groups as components of a target module.

Block 604 includes design data and design intent. The initial inputs for block diagram 600 include a design file, a design library, and design intent. Design intent is generally provided for library and design data. The design may be represented in an industrial standard format. By way of example, the industrial standard formats can be GDSII, Open Access (OA), and OASIS. However, only OA provides means of storing design intent information. For other formats, separate data structures, by way of example in a form of files, must be created to store the design intent information. Further, a layout that is a part of the design can be described in terms of geometric shapes. By way of example, geometric shapes can be polygons and paths.

Block 606 includes various processing rules and constraints. The processing rule defines the kind of data processing that can be carried out for each design intent category. By way of example, fine fracturing of the border in the layout is suited for shapes with critical geometry, whereas faster and coarse fracturing is better suited to non-critical shapes. In accordance with an embodiment of the present invention, it is necessary to avoid the division of critical shapes as much as possible, since it can result in critical dimension violations due to imperfect stitching.

Block 608 includes various output target parameters. These output targets define the structure of a desired output, which can include the required value of throughput, accuracy, and precision. Proximity effect model 612 includes information necessary for performing proximity effect correction. Details pertaining to the proximity effect are provided in conjunction with FIGS. 7 and 8.

Distortion model 614 includes information necessary for distortion correction. Each of the blocks 602, 604, 606, 608; proximity effect model 612, and distortion model 614 are provided as an input to stencil design system 610. The outputs of stencil design system 610 are cell table 616 and stencil layout data 618. Cell table 616 includes information on CP cells that are relevant to the writing process and the stencil layout file. Subsequently, the cell table gives an input to particle beam writer 620, which then writes the patterns on the wafer.

Stencil layout data 618 describes the geometry of the stencil. In accordance with an embodiment of the present invention, the stencil data can be provided as a file in a standard format. By way of example, the standard format can be GDSII. This file is then transferred to a mask shop 622. Mask shop 622 makes a stencil mask 624 that is used by particle beam writer 620.

In accordance with various embodiments of the present invention, stencil design rules are included as an input to the stencil design system. Stencil design rules describe currently available stencil-manufacturing technologies. For example, the constraints for different design intent categories differ, to achieve optimal balance between quality and speed; loose constraints may be set for less critical design constituents and tight constraints may be assigned to more critical ones.

In accordance with an embodiment of the present invention, the design intent can be used to avoid occurrence of stitching errors, which are present in critical areas.

Figure 7:
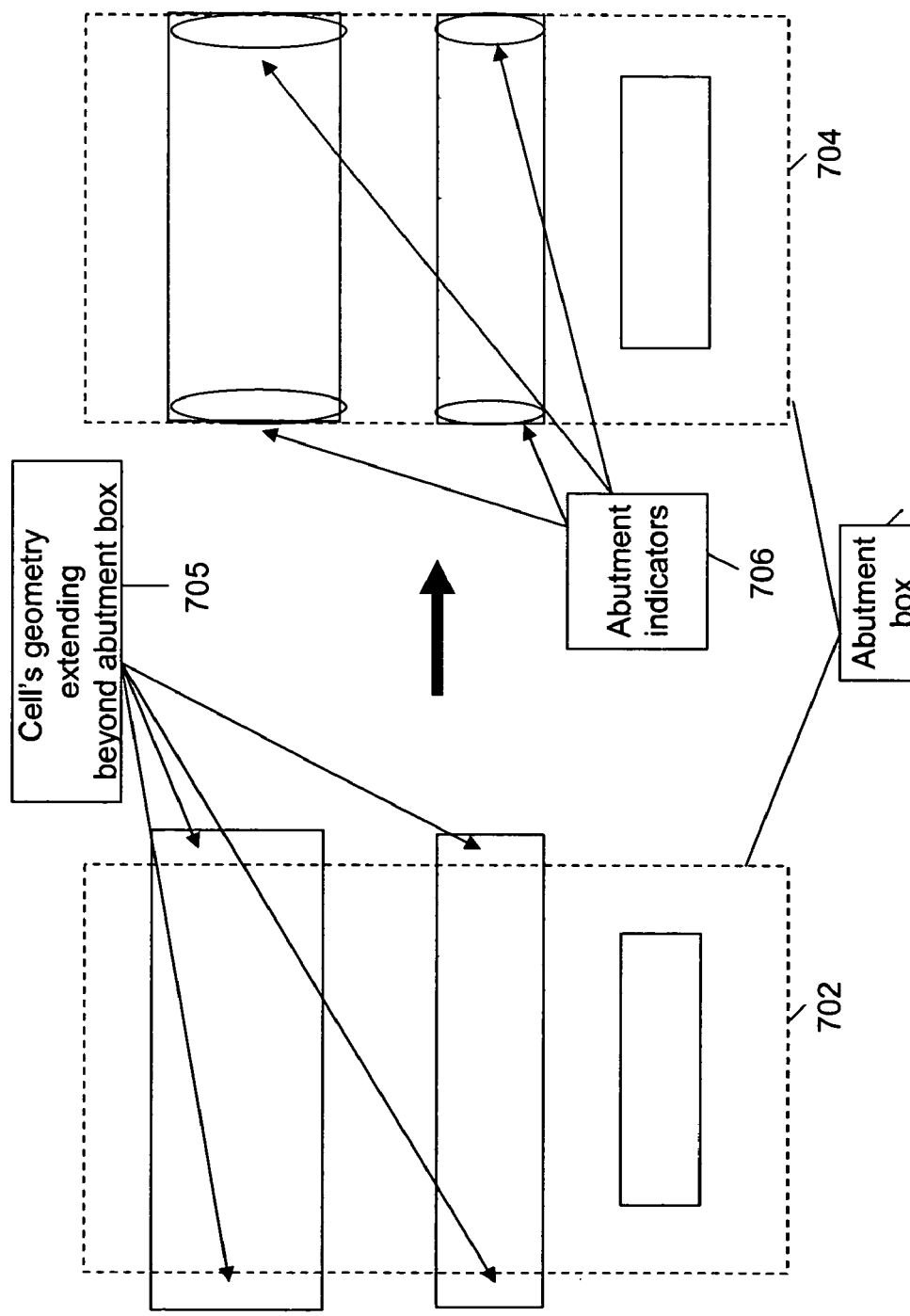
FIG. 7 illustrates a data structure for performing proximity effect correction per CP cell, in accordance with an embodiment of the present invention.

FIG. 7 illustrates an example of a data structure suitable for performing proximity effect correction per CP cell, in accordance with an embodiment of the present invention. FIG. 7 includes a cell 702 in a standard representation, an to abutment box 703, a CP cell 704, a cell's geometry extending beyond abutment box 705, and abutment indicators 706. An abutment box is usually, but not necessarily, the place and route boundary for a standard cell. CP cell 704 is clipped by abutment box 703.

Generally, the geometry of a CP cell corresponds to the geometry of a standard cell or a memory cell. To achieve better writing quality, proximity effects must be corrected by a geometry modification. It is desirable to perform such correction on a per cell basis so that the corrected geometry can be placed on a stencil in a form of a CP cell to achieve better writing quality. However, the amount of corrections received by a standard cell during a conventional proximity correction procedure depends on geometry that surrounds the cell.

Conventionally, the part of a cell's geometry that extends beyond abutment box 703 is overlapped with an abutting cell's geometry. Since such information is usually absent in the conventional data representation, a conventional proximity effect correction engine modifies cell's geometry extending beyond abutment box 705 during hierarchical correction as they were isolated. Later, on higher level of the hierarchy, such pieces must be re-corrected as they overlap with geometries of abutting cells. This creates inefficiencies in the correction process and makes cell wise correction process hard or even impossible.

An embodiment of this invention illustrates a way of solving the problem. In a new data structure, pieces of cell's geometry extending beyond abutment box 705 are marked as outer geometry, and the parts of abutment box 703 where cell's geometry extends beyond box 703 are marked with abutment indicators 706.

During a correction process, a correction engine reads abutment indicator 706 and modifies the cell's geometry assuming that the places marked by abutment indicators 706 are supposed to extend beyond abutment box 703. For example, the engine can avoid creating serifs at the corners, as on the higher hierarchy level the corners will disappear because of geometry of abutting cells. Outer pieces of cell's geometry extending beyond abutment box 705 are modified afterwards. When modifying the outer pieces, corrected geometry inside abutment box 703 is fixed and not modified. Such process enables cell wise correction and significantly increases efficiency of a hierarchical correction procedure.

Figure 8:
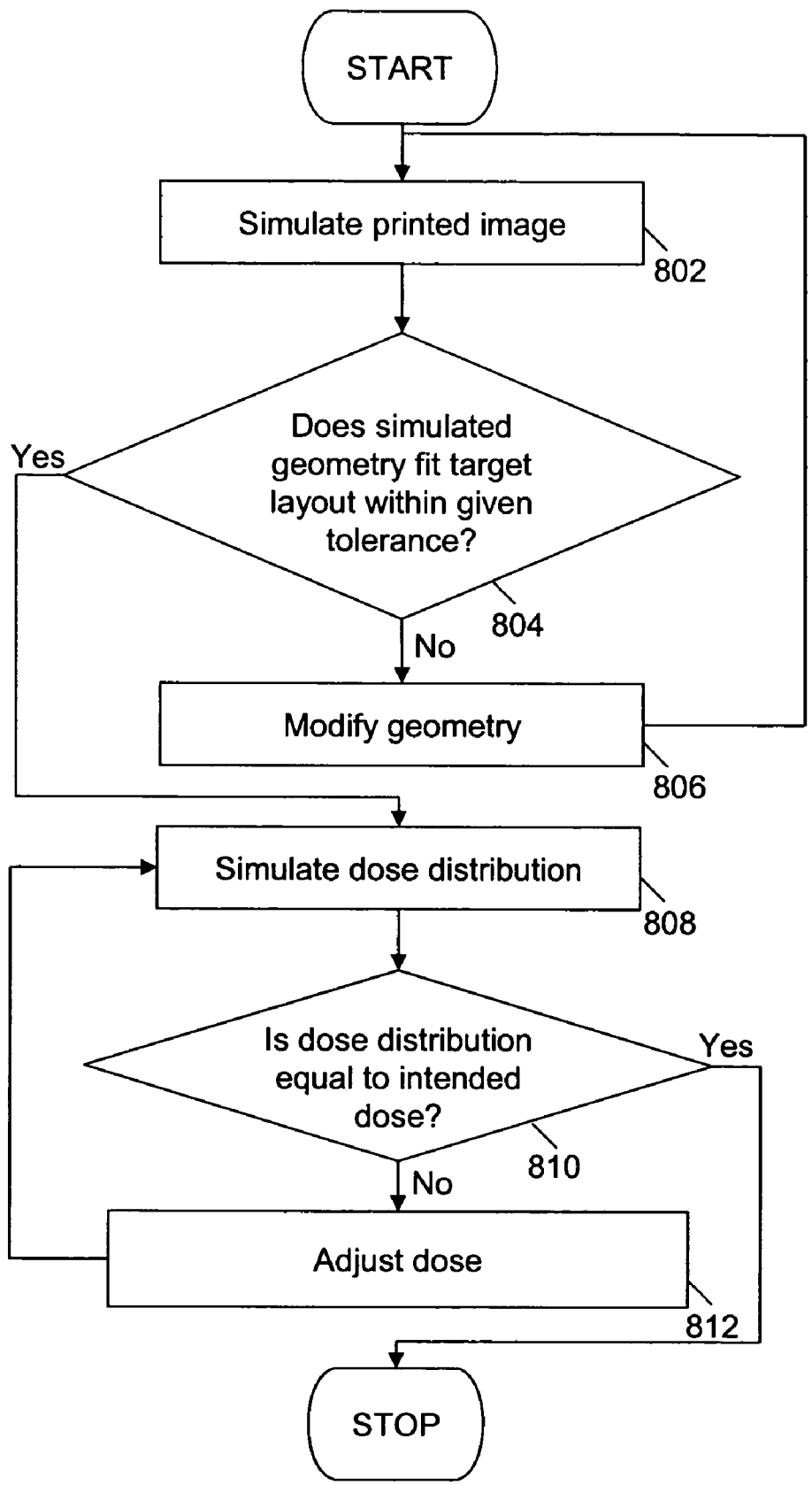
FIG. 8 illustrates a flowchart for performing proximity effect correction, in accordance with an embodiment of the present invention.

FIG. 8 illustrates a flowchart for performing proximity effect correction, in accordance with an embodiment of the present invention. Proximity effect correction brings about higher accuracy in particle beam writing. Due to the proximity and other effects, geometry of printed figures differs from the intended geometry. To bring the geometry of printed shapes closer to the target layout geometry, proximity effect and writing distortion correction is necessary. This is done by changing shapes that constitute a layout.

At act 802, a simulation of printed image is performed. At act 804 it is determined whether simulated geometry fits target layout within a given tolerance. If the simulated image does not fit the target layout, modifications of geometry are performed at act 806. Acts 802-806 are performed iteratively until the necessary fit is reached.

When the simulated image fits the layout geometry within given tolerance, the system proceeds to act 808, where dose distribution is simulated. The dose distribution is simulated for the whole layout. At act 810, it is determined whether the simulated dose distribution is equal to the intended dose distribution. The intended dose distribution is within the given tolerance. If the simulated dose distribution is not equal to the intended dose distribution within given tolerance, dose adjustment is performed at act 812. Acts 808-812 are performed iteratively, until the calculated dose distribution fits the intended dose distribution. However, if the simulated dose distribution fits the desired dose within the desired tolerance, then the process is stopped.

In accordance with an embodiment of the present invention, high-precision proximity effect correction can be effected by using the modification of patterns of CP cells. The proximity effect can be optimized by calculating and optimizing deposition energy at a set of distinguished points called target points. The following equation is an example of an approximation to the proximity effect using Gaussian functions:

$$f_P(x, y) = k \left[ \exp\left(\frac{-(x^2 + y^2)}{\beta_f^2}\right) + \eta_\varepsilon \frac{\beta_f^2}{\beta_b^2} \exp\left(\frac{-(x^2 + y^2)}{\beta_b^2}\right) \right] \quad (1)$$

where $f_p$ denotes deposition energy distribution caused by illuminating resist with a point source (called point spread function), $\beta_f$ is a parameter called forward scattering range, $\beta_b$ is a parameter called backward scattering range, $\eta_E$ denotes ratio of energy spread caused by the forward and backward scattering, and k is a normalization constant.

By way of example, using equation (1), deposition energy F in the resist at a point (X, Y) in the domain D of the wafer can be expressed by the following integral:

$$F(X, Y) = \iint_D f_P(X - x, Y - y) m(x, y) \, dx \, dy \quad (2)$$

where function m (x, y) denotes energy density distribution of electrons that are projected on the wafer to write image 114. For example, for a typical electron beam writer, m(x,y) is a step function equal to 1 where electrons pass through shaping apertures, and 0 where electrons are blocked by some shaping aperture. The function m(x,y) corresponds to the layout that is being written on a wafer. In the given example, m(x,y)=1 in the points covered by the layout figures, and m(x,y)=0 in all other places. If one changes the layout, the function changes correspondingly.

With reference to the above-mentioned model, proximity effect correction is formulated by the following optimization problem:

a) Determine the set of target points (X1, Y1), (X2, Y2), . . . , (XN, YN). The deposition energy is evaluated at these points. The placement and number of the target points is very important to achieve better correction. More target points typically correspond to better correction but slow the correction process down. It is therefore very important to minimize the number of target points and to optimize their locations to achieve better correction result.

b) Determine target deposition energy at the above-mentioned target points. Consider $F_T(X1, Y1), F_T(X2, Y2), \ldots F_T(XN, YN)$ as deposition energy at the target images.

c) Compute difference between deposited energy at observation points F (X1, Y1), F (X2, Y2), . . . F (XN, YN), and target deposition energy at target images $F_T(X1, Y1), F_T(X2, Y2), \ldots F_T(XN, YN)$:

$$D(X1, Y1) = F_T(X1, Y1) - F(X1, Y1),$$

-continued $$D(X2, Y2) = F_T(X1, Y1) - F(X1, Y1),$$

$$\ldots$$

$$D(XN, YN) = F_T(XN, YN) - F(XN, YN),$$

In order to minimize D(X1, Y1), D(X2,Y2), ..., D(XN, YN), the border of each shape that forms the plurality of shapes constituting the layout, is fragmented into smaller pieces. Each one of these pieces is assigned one or more target points. The pieces are moved during the correction process, while the positions of the target points remain unchanged. In accordance with the values of D(X, Y) calculated at the target points, each piece is moved inwards or outwards the shape. The amounts of such movements are calculated by using the optimization theory. Since the shapes are changing, the layout function m (x, y) changes correspondingly. Consequently, values of function D(X, Y) at each target point change.

The process of calculating the dose and changing layout is repeated iteratively until the error drops beyond a certain desirable value.

An embodiment of the present invention relates to re-using the available CP cell library and available stencil mask for writing another layout pattern. This aspect of the invention enables the desired geometry being written by providing one CP shot and a few extra variable-shape beam (VSB) shots, without making a new stencil. Such a combination of CP and VSB shots uses an available CP cell. The CP shot can be made with an under-dose of a particle beam. The doses are calculated in such a way that only the desired part receives the proper dose. This technique has been explained in conjunction with FIG. 9 and FIG. 10.

Figure 9:
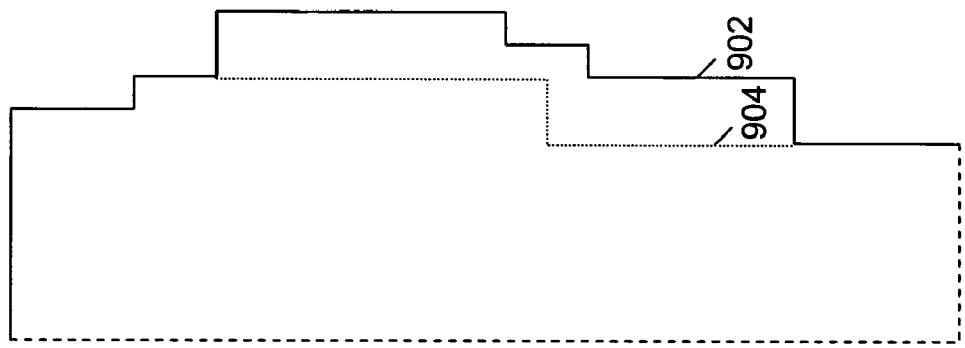
FIG. 9 illustrates an example of flexible writing of patterns, in accordance with an embodiment of the invention.

FIG. 9 illustrates an example of a layout dependent correction result. During proximity effect correction, layout figure change shapes. The amount of the changes for each figure depends not only on geometry of the shape itself, but also on the geometry of surrounding shapes. If a group of shapes constitutes a CP cell (for example, a standard cell from a library is chosen to be a CP cell), and the shapes of this group are corrected, the resulting corrected shapes are different from layout to layout. Therefore, one needs to create a separate stencil mask for each layout. It is desirable however to keep the stencil mask independent of layout as much as possible, to enable re-using stencils between layouts. A flexible writing of patterns, in accordance with an embodiment of the present invention, addresses this problem. Flexible writing of patterns enables pattern writing by re-using a stencil mask without significant increase of shot numbers. This is achieved by combining CP cell and VSB writing with a low dose.

By way of example of a layout dependent correction result for a CP cell is given on FIG. 9. Shape 902 results from correcting one layout, while shape 904 results from correcting another layout. The geometries are different. Therefore, one either has to prepare separate CP cells to accommodate these two geometries, or prepare a CP cell containing shape 904 only and use a number of VSB shots to complete shape 902 where necessary. If however a stencil has been made that contains FIG. 902, one cannot write shape 904 using the conventional art, as there is no way of reducing the exposure dose after an exposure has been made. According to an embodiment of the present invention, it is becomes possible to write shape 904 using a CP cell with shape 902 plus few extra VSB shots. The method has been explained in conjunction with FIG. 10.

Figure 10:
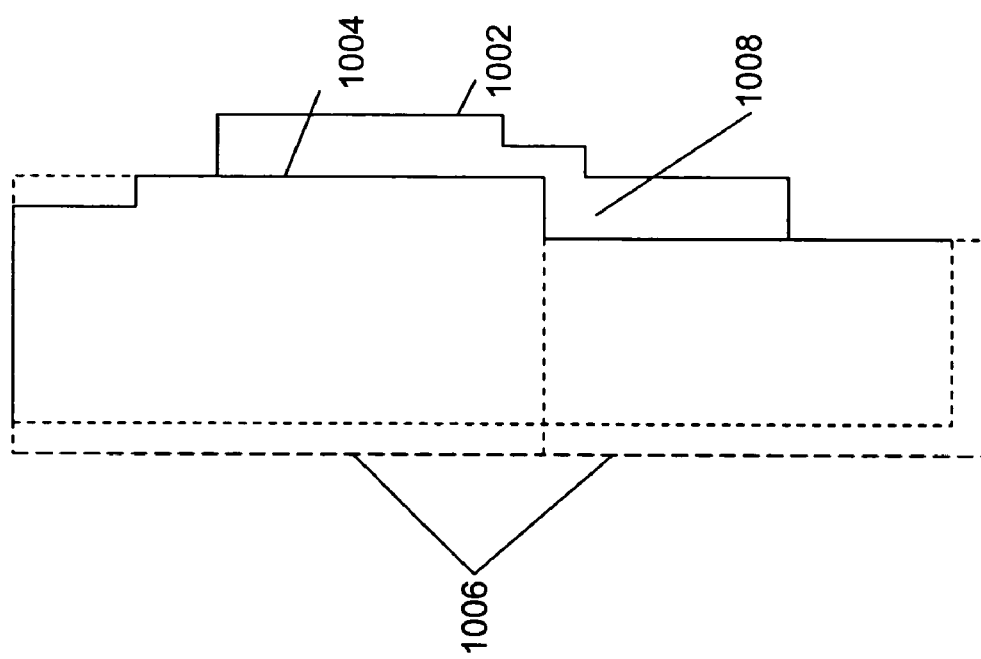
FIG. 10 illustrates another example of flexible writing of patterns, in accordance with an embodiment of the present invention.

FIG. 10 illustrates an example of flexible writing of patterns, in accordance with an embodiment of the present invention. FIG. 10 includes shapes 1002, 1004, 1006, and 1008. Shape 1002 is provided on a stencil and is written as underexposed. Shape 1004, which is to be printed on a wafer, is a trimmed version of shape 1002. Shapes 1006 are the trimming shapes written using underexposure dose. This dose is calculated so that shape 1004 receives dose that is enough for exposure. Since shape 1002 was written as underexposed and only region that correspond to shape 1004 received additional dose by writing shapes 1006, the region 1008 remains underexposed and therefore does not print on a wafer.

In an embodiment of the present invention, the decrease in the throughput of the writing system, through flexible writing patterns, is negligible in comparison with the conventional approach. The conventional approach would either require whole FIG. 1004 to be written by VSB method (which takes time if the figure has complicated shape), or require making a new stencil.

In accordance with an embodiment of the present invention, the arrangement of CP cells is critical because this influences the throughput of the electron-beam writer. By way of example, there can be particle beam writing devices that require a longer time for long-distance move of a particle beam, in comparison to its shorter move. Further, the writing time changes, depending on how the CP cells are arranged on the stencil. Consequently, it is possible for the particle beam writer to improve the throughput if mutually related cells are placed nearby in the stencil. This technique has been explained in conjunction with FIGS. 11 and 12.

Figure 11:
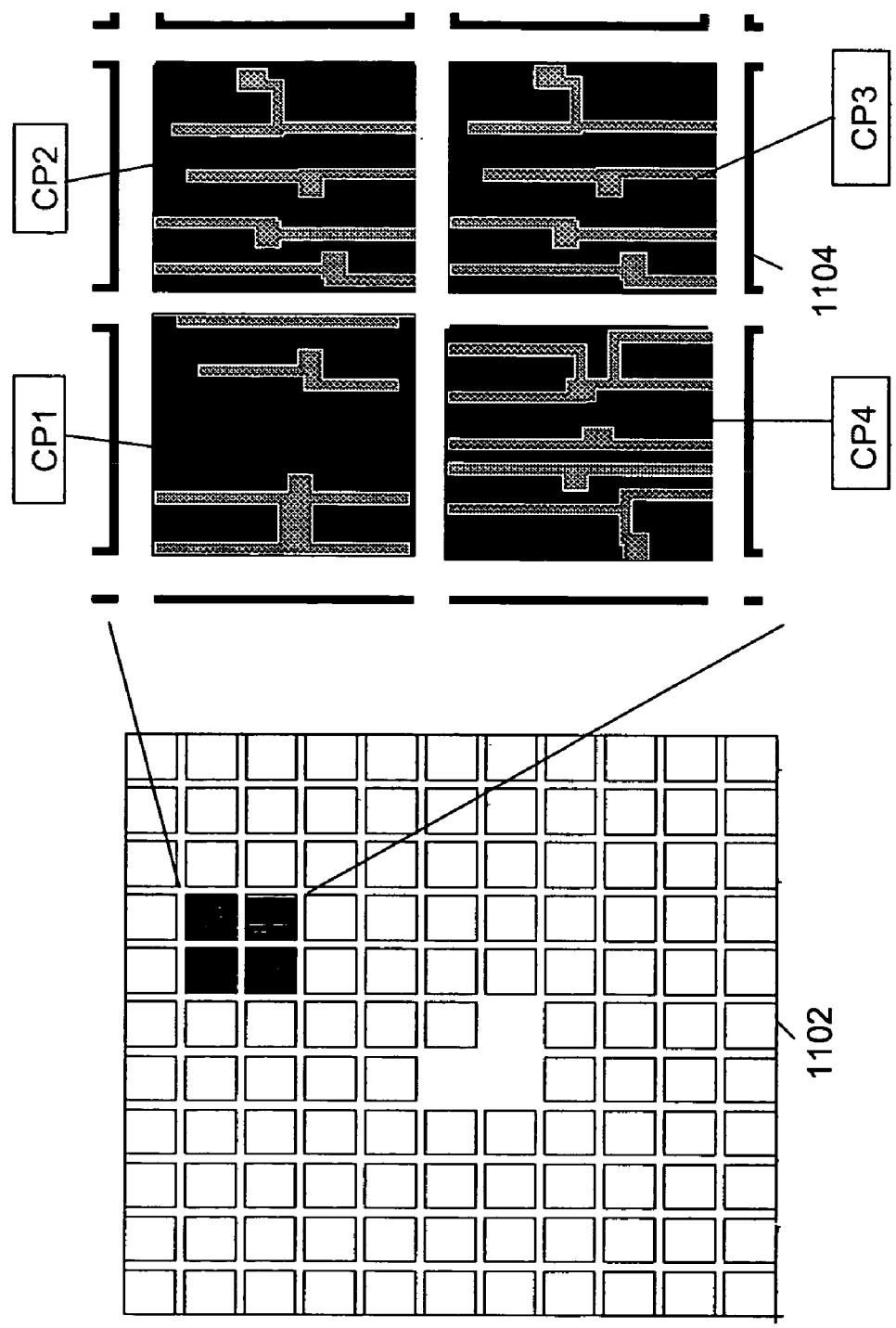
FIG. 11 illustrates an example of an arrangement of CP cells, in accordance with an embodiment of the present invention.

FIG. 11 illustrates an example of an arrangement of CP cells, in accordance with an embodiment of the present invention. FIG. 11 includes blocks 1102 and 1104. For example, block 1102 includes CP1, CP2, CP3 and CP4 on the stencil; CP1, CP2, CP3, and CP4 are related to each other, by way of example, represent different parts of one large standard cell like those depicted on FIG. 3 and FIG. 5, and are written in a continuous sequence; and block 1104 illustrates a stencil design for such related CP cells.

Figure 12:
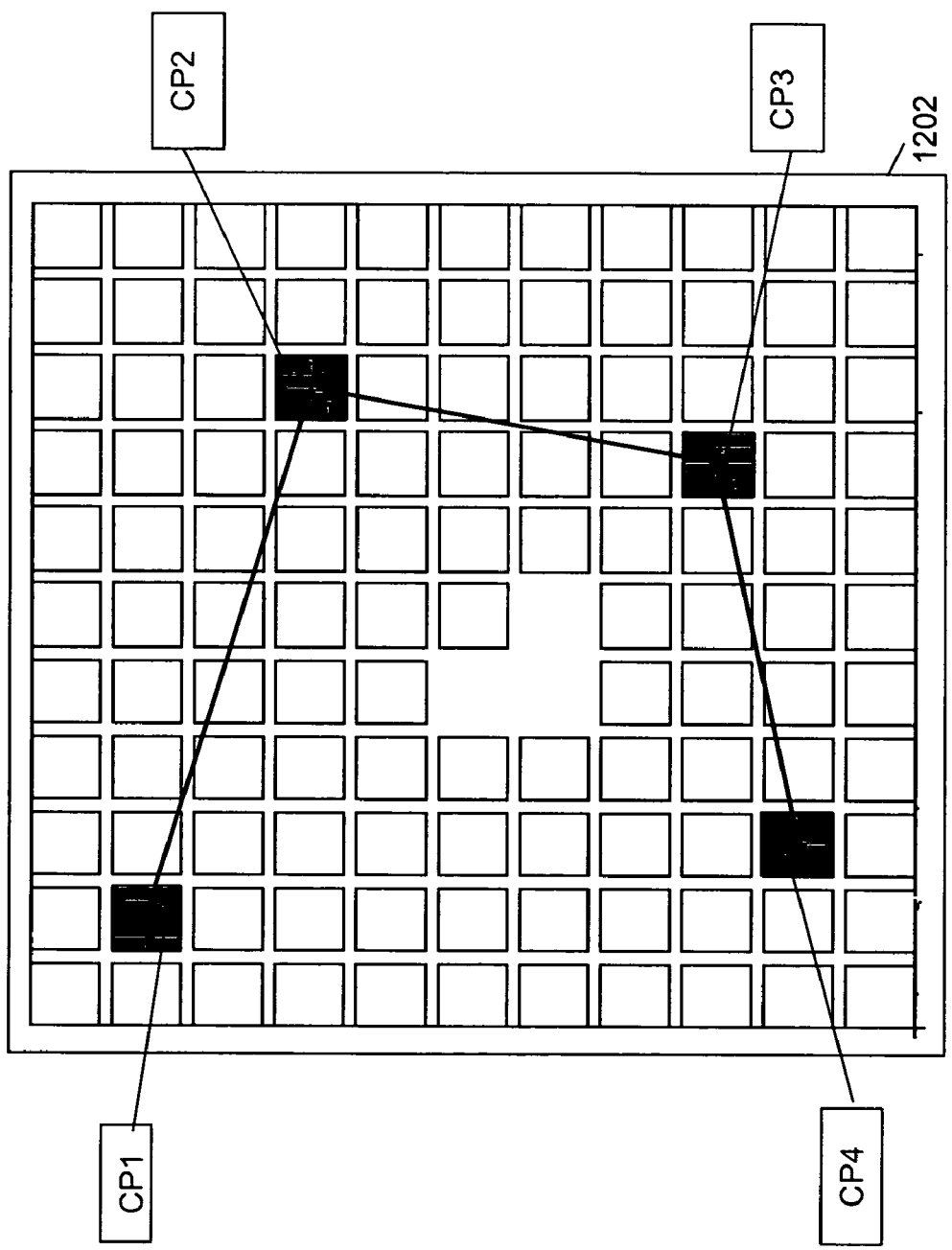
FIG. 12 illustrates an example of an arrangement of CP cells, in accordance with conventional art.

FIG. 12 illustrates another example of an arrangement of CP cells CP1, CP2, CP3 and CP4. FIG. 12 includes a stencil design for those CP cells, as illustrated in block 1202. The distance required to move between CP1, CP2, CP3, and CP4 by the electron-beam in block 1202 is larger than the distance to be traversed by the electron-beam in block 1102. Therefore, a part of a layout that includes CP cells CP1, CP2, CP3 and CP4 can be written faster using layout 1102 and 1104.

Figure 13:
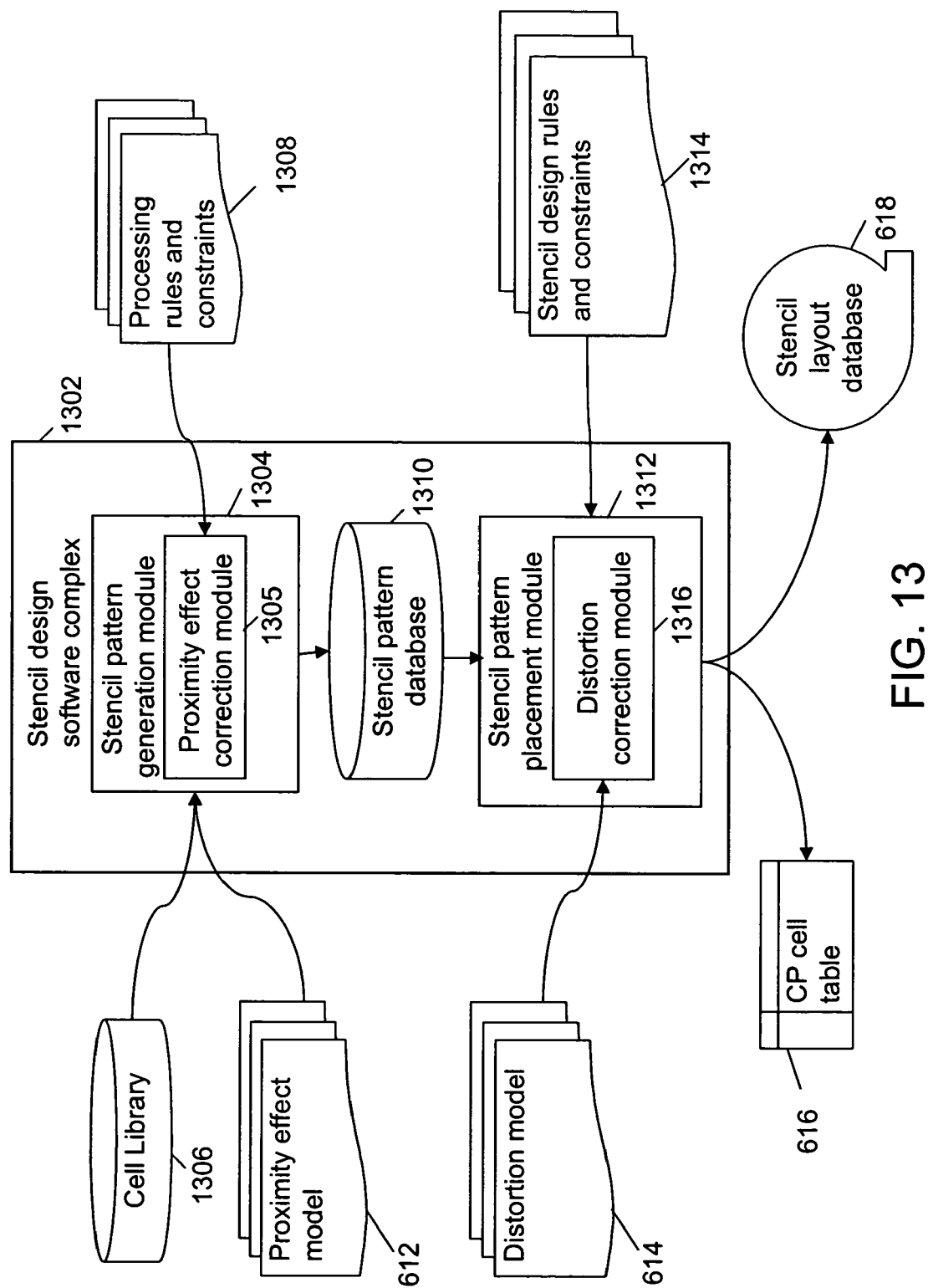
FIG. 13 illustrates a block diagram of a stencil design system, in accordance with an embodiment of the present invention.

FIG. 13 illustrates a block diagram for a stencil design system in accordance with various embodiments of the present invention. The block diagram includes a stencil design software complex 1302. Software complex 1302 includes a stencil pattern generation module 1304, a stencil pattern database 1310, a stencil pattern placement module 1312, and a block for stencil design rules and constraints 1314. Stencil pattern generation module 1304 includes a proximity effect correction module 1305. Stencil pattern placement module 1312 includes a distortion correction module 1316.

One of the inputs of stencil design software complex 1302 is a cell library 1306. Generally, cell library 1306 is a standard cell library, a memory cell library, or any set of writing patterns. The library format can be GDSII, OA, OASIS or any other data format suitable for storing geometrical patterns. Cell library 1306 can also contain design intent information as was illustrated by FIG. 6, which further facilitates proper stencil design for fast and accurate particle beam writing. In particular, the OA database format makes it possible to embed design intent information into a cell library. Yet another input of stencil pattern generation module 1304 is a set of processing rules and constraints 1308 that contains information necessary for forming stencil pattern database 1310. During the stencil pattern generation phase, it is possible to make proximity effect corrections using proximity effect model 612. Proximity effect model 612 is supplied to proximity effect correction module 1305. Proximity effect model 612 includes forms or files for parameters, special instructions, and scripts needed to perform proximity effect simulations and corrections, in accordance with embodiment of the present invention. This has been explained with reference to FIGS. 7 and 8. The functionality of stencil pattern generation module 1304 is further explained in FIG. 14. The output of stencil pattern generation module 1304 is stencil pattern database 1310 that contains geometric patterns of CP cells. The format of stencil pattern database 1310 can be GDSII, OA, or any data format suitable for storing geometric patterns. In particular, using OA as the data formats makes it possible to embed design intent information into stencil pattern database 1310 to compose better stencil layout for fast and accurate pattern writing.

Stencil pattern database 1310 generated by stencil pattern generation module 1304 is used by stencil pattern placement module 1312 to generate stencil layout 618 and CP cell table 616. Stencil layout is generated either automatically or manually through a graphical user interface (GUI) using a set of stencil design rules and constraints 1314. During the stencil pattern placement, it is also possible to make writing distortion corrections using distortion model 614. Distortion model 614 is supplied to distortion correction module 1316. Distortion model 614 includes forms or files for parameters, special instructions, and scripts needed for distortion simulations and corrections, in accordance with embodiment of the present invention.

The outputs of stencil design software complex 1302 are stencil layout 618 that contains all information necessary to manufacture a stencil mask, and CP cell table 616. CP cell table 616 contains information about CP cell placement on a stencil and is used for writing data preparation (a process when an actual layout of an integrated circuit or so is processed to generate data acceptable for a writing machine; depicted as act 204 on FIG. 2). Another output of stencil design software complex 1302 is stencil pattern database 1310 that is also used during the writing data preparation.

Figure 14:
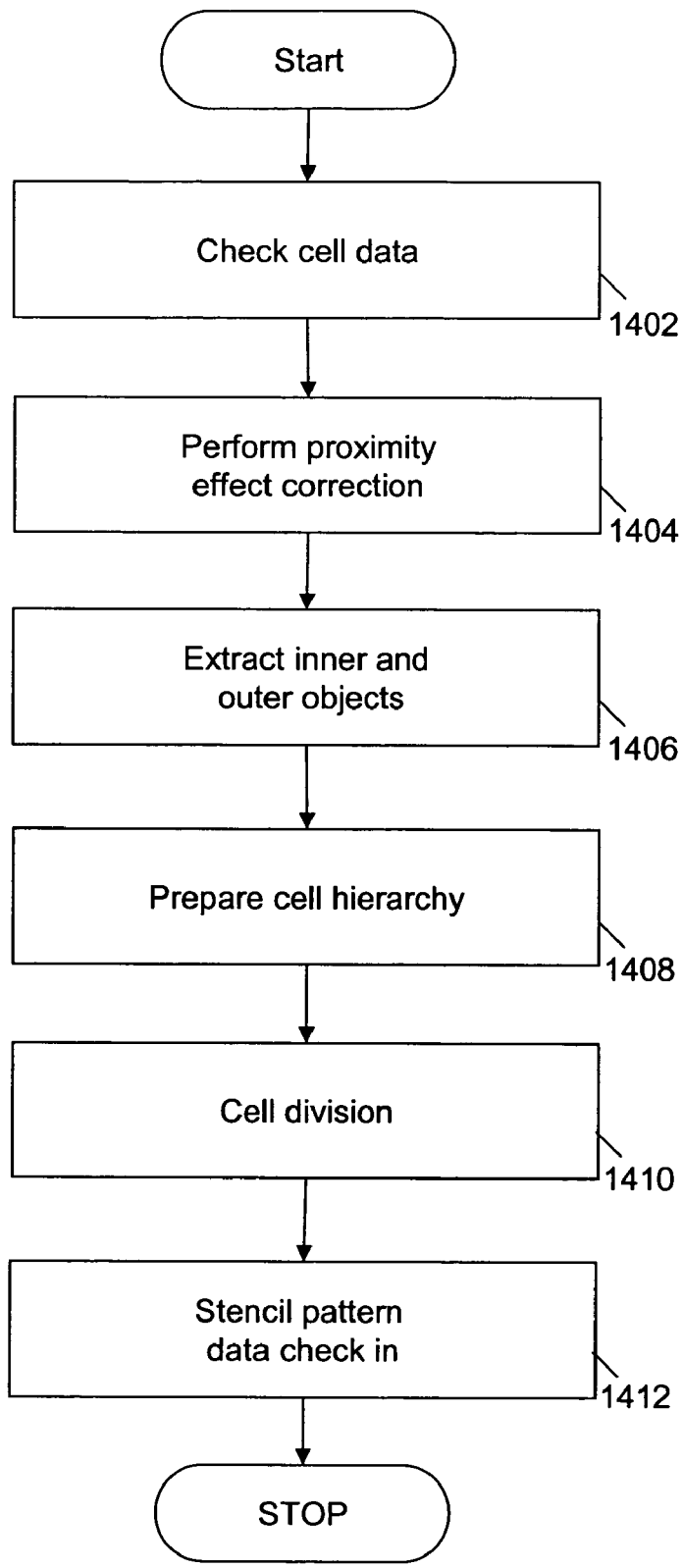
FIG. 14 illustrates a flowchart for a stencil pattern generation module, in accordance with an embodiment of the present invention.

FIG. 14 illustrates the functionalities of a stencil pattern generation module 1304 that has been introduced in FIG. 13 (stencil pattern generation module 1304), according to various embodiments of the present invention. At act 1402, cell data is checked out. The cell data is checked from cell library 1306. At act 1404, proximity effect corrections are performed. The proximity effect corrections are performed by proximity effect correction module 1304. To perform proximity effect corrections, proximity effect correction module 1304 uses information and instructions provided by proximity effect model 612. The proximity corrections are performed according to various embodiments of the present invention (FIGS. 7, 8, 9, 10). The proximity effect corrections can be performed either automatically or manually, or by combining the both, as has been further explained in relation with FIG. 4.

At act 1406, the inner and outer objects are extracted. The inner objects can be placed on a stencil. The outer objects are not placed on a stencil, but later put into stencil pattern database 1310 together with the inner objects, and used during writing data preparation.

At act 1408, cell hierarchy is prepared. The cell hierarchy is prepared for each cell using inner and outer objects as extracted at act 1406.

It is possible that a pattern that constitutes a cell violates some constraints. By way of example, a cell may exceed maximum allowable CP cell size, or it may contain doughnut patterns, or leaf patterns. In each of these examples, it is necessary to separate a cell into a plurality of cells each satisfying the constraints. Therefore, stencil pattern generation module reads processing rules and constraints 1308, checks whether each cell satisfies the constraints, and if not, performs act 1410. At act 1410, a cell is separated. The separation is according to the rules. During act 1410, various embodiments of the present invention (FIGS. 3, 5) can be utilized. According to an embodiment of the present invention (FIG. 3), a new hierarchy representation for each cell is built after act 1410. At act 1412, the stencil pattern data is checked into stencil pattern database 1310.

Figure 15:
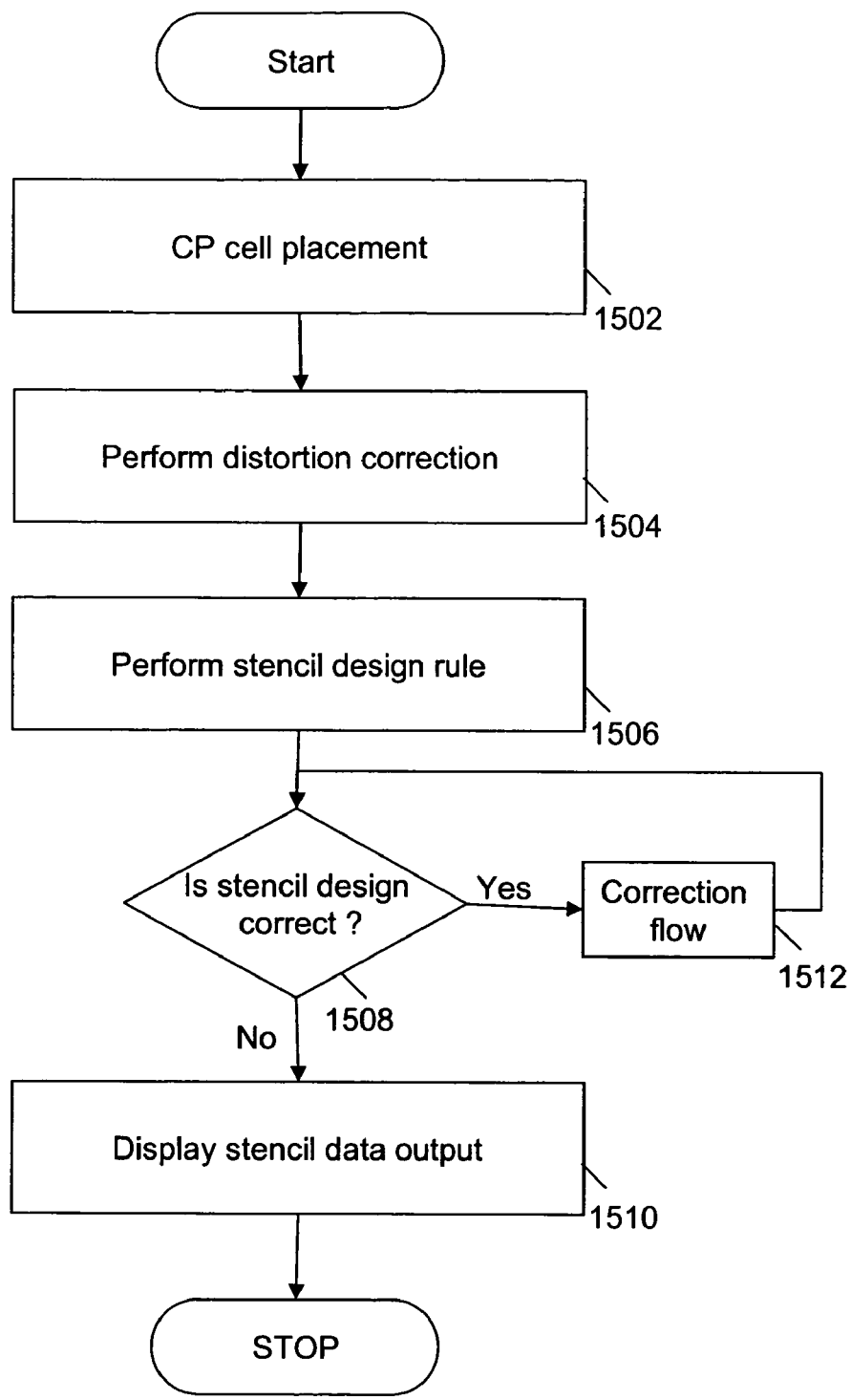
FIG. 15 illustrates a flowchart for a stencil pattern placement module, in accordance with another embodiment of the present invention.

FIG. 15 illustrates the functionalities of a stencil pattern placement module 1312, which has been introduced in FIG. 13 (stencil pattern placement module 1312), according to various embodiments of the present invention. At act 1502, placement of CP cells is performed. This is done by reading the stencil pattern database 1310. The placement is also performed in accordance with stencil design rules and constraints 1314. Act 1502 is performed either manually by using GUI, or automatically, or by arbitrary combination of automatic and manual operations.

When a stencil is placed into a writing machine and used for writing, CP cells may be written with distortions, due to imperfections of any writing machine's design. Many of these distortions depend on position of a CP cell on a stencil and can be corrected by changing geometry of patterns that constitute a CP cell. The distortion correction flow repeats the proximity correction flow according to an embodiment of the present invention (FIG. 8) except the dose corrections are not performed in the case of distortion corrections. Distortion corrections are performed at act 1504. The distortion corrections are performed by distortion correction module 1316. Distortion correction module 1316 uses information and instructions provided by distortion model 614. The distortion corrections can be performed either automatically, or manually, or by combining the both, the same way as further explained in relation with FIG. 4.

To make sure that a stencil mask can be manufactured, it is necessary to check that the stencil satisfies all stencil design rules and constrains. Accordingly, at act 1506, stencil design rule check is performed. At act 1508, it is determined whether the stencil design is correct. If the stencil layout is correct then at act 1510, the stencil data output is displayed and stored in CP cell table 616 and stencil layout database 618.

CP cell table 616 is stored in the form of files. Generally CP cell table 616 is a text file that contains a table of CP cells and other information necessary for writing data preparation. Stencil layout database 618 can be a geometric pattern file in GDSII format, although any other representations (an OASIS file, a writing machine pattern file, an OA database, etc.) are possible. Usually, stencil layout is transferred to a mask shop, where it is used to manufacture a stencil mask.

If however check 1508 is not passed and some design rules and constraints violations are found, it is necessary to analyze the violations and perform necessary steps to avoid them. It is done during correction flow at act 1512. The correction flow is a very complicated task. Actions performed inside this flow depend on a nature and a cause of each violation. After the correction flow is performed, stencil design rule check is done again. Acts 1508 and 1512 are repeated until the stencil design rule check step found no stencil design rule violations.

Various embodiments of the present invention enable creating a stencil layout suitable for fast and accurate CP-type particle beam writing. This is achieved by supplying designer and particle beam writer with stencil design result information in the form of a data structure.

Various embodiments of the present invention relate to facilitating proximity effect correction, which is achieved by modifying CP cell patterns. This facilitates a very precise particle beam writing system. Further, the throughput of the particle beam writing system is increased in comparison with the conventional art.

Various embodiments of the present invention facilitate optimal designing of a stencil. Further, wearing out of a stencil is reduced by preparing two or more frequently used CP cells on the stencil.

Various embodiments of the present invention relate to a configuration of a stencil design system. This is achieved by facilitating proximity effect simulation, the execution of simulations, and the subsequent display of the results.

Various embodiments of the present invention relate to CP cell placement on the stencil. Various embodiments of the present invention provide an effective manner of handling CP cells made of split patterns. This is achieved by placing such CP cells in adjacent positions on the stencil.

Various embodiments of the present invention relate to the configuration of a CP cell on the stencil. This is characterized by placing two or more CP cells of the same pattern on a stencil, because it is possible that a CP cell is used many times. As a result, the particle beam writing quality is reduced. If such a problem occurs, the stencil is required to be cleaned frequently. To resolve this problem, a plurality of CP cells is prepared, resulting in a longer interval between clearing procedures.

A system, as described in the present invention or any of its components, may be embodied in the form of a computer system. Typical examples of a computer system include a general-purpose computer, a programmed microprocessor, a micro-controller, a peripheral integrated circuit element, and to other devices or arrangements of devices that are capable of implementing the acts of the present invention, including a computer readable medium having computer readable program code embodied therein, as is well understood in the art.

While the preferred embodiments of the present invention have been illustrated and described, it will be clear that the present invention is not limited to these embodiments only. Numerous modifications, changes, variations, substitutions and equivalents will be apparent to those skilled in the art, without departing from the spirit and scope of the present invention, as described in the claims.

What is claimed is:

1. A method for designing a stencil for particle beam writing and fabricating device, the method comprising the steps of:
   storing a cell projection (CP) cell library information for a plurality of CP cells in the form of a data structure, the cell projection library information being generated by a stencil design system;
   referencing the CP cell library data by a particle beam writing system; and
   performing a proximity effect correction, the proximity effect correction being performed by modifying a plurality of CP cell patterns in the CP cell library, wherein the proximity effect correction is further performed based on a deposition energy, wherein performing proximity effect correction comprises the steps of:
   determining a plurality of observation points for each of a plurality of simulated printed images of the CP cell patterns, each of the observation points being placed on a perimeter of a shape of one of the simulated printed images;
   determining a plurality of target deposition energies at the observation points, the plurality of target deposition energies being the required deposition energy at each of the plurality of observation points;
   computing a difference between a simulated deposited energy at each of the plurality of observation points and the corresponding target deposition energy; and
   minimizing the difference between the simulated deposited energy at each of the plurality of observation points and the corresponding target deposition energy by moving edges of the CP cell pattern shapes, while keeping the observation points fixed
   writing patterns on the device depending on the referenced CP cell library information.

2. The method of claim 1, further comprising computing an improvement of the throughput of the particle beam writing system using the CP cell library information, compared to the throughput of the particle beam writing system when using a method other than the CP cell library information.

3. The method of claim 2, wherein the throughput of the particle beam writing system using the CP cell library information is compared to the throughput of the particle beam writing system using VSB shots.

4. The method of claim 1, further comprising the step of using a design library as input to the stencil design system, the design library comprising a plurality of cells.

5. The method of claim 4 wherein the stencil design system partitions a pattern of one design library cell, generating a plurality of CP cells from the pattern of the design library cell.

6. The method of claim 5 wherein the size of the design library cell exceeds a predetermined maximum for a single CP cell.

7. The method of claim 5 wherein the partitioning of the design library cell pattern comprises avoiding the cutting of shapes in the pattern in critical areas of the library cell, thereby reducing stitching alignment errors.

8. The method of claim 5 further comprising the step of placing the plurality of CP cells in mutually adjoining positions on the stencil, thereby improving throughput of the particle beam writing system compared to placing the plurality of CP cells distant from each other on the stencil.

9. The method of claim 1, further comprising providing to the stencil design system target parameters for the generated cell projection library information, the parameters being selected from a group comprising particle beam writing system throughput, pattern accuracy, pattern precision, and stencil mask configuration.

10. A system for designing a stencil for particle beam writing, to fabricate device, the system comprising:
   a stencil pattern generation module, the stencil pattern generation module generating a stencil pattern database, the stencil pattern database comprising a plurality of geometric patterns of CP (Cell Projection) cells, the stencil pattern generation module comprising a proximity effect correction module; and
   a stencil pattern placement module, the stencil pattern placement module generating a stencil layout and a CP cell table;
   wherein the proximity effect correction module performs proximity effect correction comprising the steps of:
   determining a plurality of observation points for each of a plurality of simulated printed images of CP cell patterns, each of the observation points being placed on a perimeter of a shape of one of the simulated printed images;

determining a plurality of target deposition energies at the observation points, the plurality of target deposition energies being the required deposition energy at each of the plurality of observation points;

computing a difference between a simulated deposited energy at each of the plurality of observation points and the corresponding target deposition energy; and minimizing the difference between the simulated deposited energy at each of the plurality of observation points and the corresponding target deposition energy by moving edges of the CP cell pattern shapes, while keeping the observation points fixed.

11. The system of claim 10 further comprising a computing improvement module, the computing improvement module computing an improvement of the throughput of the particle beam writing system using the generated stencil pattern database, in comparison with the throughput of the particle beam writing system when not using the generated stencil pattern database.

12. The system of claim 10, wherein the particle beam writing comprises an electron beam writing.

* * * * *